United States Patent [19]

Jaccodine et al.

[11] 4,284,659
[45] Aug. 18, 1981

[54] INSULATION LAYER REFLOW

[75] Inventors: Ralph J. Jaccodine, Allentown, Pa.; Ami Kestenbaum, East Windsor Township, Mercer County, N.J.

[73] Assignees: Bell Telephone Laboratories, Murray Hill, N.J.; Western Electric Co., Inc., New York, N.Y.

[21] Appl. No.: 148,858

[22] Filed: May 12, 1980

[51] Int. Cl.³ .............................................. B05D 3/06
[52] U.S. Cl. ........................... 427/53.1; 219/121 LE; 219/121 LF; 29/879
[58] Field of Search ........................... 427/53.1, 376.2; 219/121 LE, 121 LF; 29/852, 879, 885

[56] References Cited

U.S. PATENT DOCUMENTS

| | | | |
|---|---|---|---|
| 3,585,088 | 6/1971 | Schwuttke | 427/53.1 |
| 3,825,442 | 7/1974 | Moore | 427/85 |
| 3,911,163 | 10/1975 | Wilson | 427/53.1 |
| 4,030,952 | 6/1977 | Luce et al. | 148/188 |
| 4,039,359 | 8/1977 | Nakamoto | 148/188 |
| 4,122,240 | 10/1978 | Banas et al. | 427/53.1 |
| 4,159,686 | 7/1979 | Heim | 219/121 LF |

FOREIGN PATENT DOCUMENTS 649056  2/1979  U.S.S.R. .................................. 29/879

*Primary Examiner*—John H. Newsome
*Attorney, Agent, or Firm*—D. J. Kirk

[57] ABSTRACT

This disclosure is directed to a method of forming an interlevel dielectric glass layer (16) on a semiconductor device, the layer having a plurality of feed-through apertures (17—17) therein. A CW laser beam (29) is continuously raster scanned over the surface of the glass layer (16) to reflow the layer to densify the material and form a smooth surface topography about the apertures (17—17).

9 Claims, 6 Drawing Figures

INSULATION LAYER REFLOW

TECHNICAL FIELD

This invention is related to the formation of glass insulating layers during the fabrication of semiconductor devices. In particular, the instant technique is directed to the reflowing of such layers to form a smooth surface topography.

BACKGROUND OF THE INVENTION

In the manufacture of miniature electronic devices, such as Metal Oxide Semiconductor (MOS) devices, it is frequently necessary to establish electrical connections between two sections of the device by means of a conductive film making contact therebetween. Typically, this conducting film has a portion that overlies an insulating dielectric layer or film and makes contact through small feed-through apertures in that dielectric layer to the underlying areas of the device. To accomplish this a thin layer of dielectric material is deposited on a semiconductor substrate and the feed-through apertures are formed using well known photolithographic masking and chemical etching techniques. Such chemically etched feed-throughs typically have sharp corners resulting in insufficient thickness of conductive material deposited at the corners during subsequent processing steps, which can lead to failure of the device under high current densities.

One solution to this problem is to place the device, with the apertured insulating layer thereon, in a furnace for a predetermined period of time at an elevated temperature until the insulating material reflows to form a smooth surface topography around said apertures. Although such a technique can be most effective, it has been found that undesirable diffusion of dopants within certain devices accompany the high temperature furnace reflow operation.

Accordingly, there is a need for an insulation reflow technique which can form a smooth surface topography around the feed-through apertures without the attendant undesirable dopant diffusion.

SUMMARY OF THE INVENTION

The instant method overcomes the foregoing problem of forming a smooth surface topography around apertures in an interlevel dielectric layer in a semiconductor device. The method comprises the steps of depositing a layer of a dielectric material on a partially completed semiconductor device and forming feed-through apertures in the material. The surface of the apertured dielectric layer is then exposed to high energy radiation to reflow the layer to form a smooth surface topography around the apertures without substantially heating the surface therebelow.

IN THE DRAWING

FIGS. 1 to 5 depict various stages of processing a microelectronic MOS device in accordance with the instant invention; and FIG. 6 is a schematic diagram of apparatus to implement the instant method.

DETAILED DESCRIPTION

Figure 1:
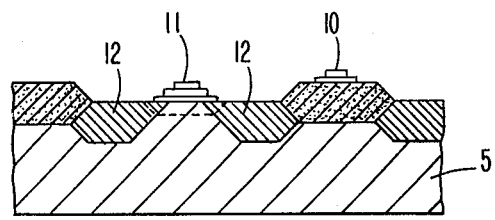

FIG. 1 depicts a silicon substrate 5 having a field electrode 10 and an MOS gate 11 as well as doped areas 12—12 which serve as source and drain, all of which may be formed using well known semiconductor processing techniques. A more detailed description of such MOS circuitry is set forth in the *IEEE Journal of Solid State Circuits*, Vol. SC-13, No. 5, page 556 dated October, 1978 and is incorporated by reference herein.

Figure 2:
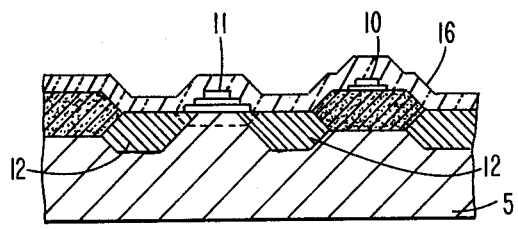

FIG. 2 shows an insulating layer 16 deposited on the substrate 5. The layer 16 is glass, such as a phosphorus doped silicate glass (P-glass) which may be deposited using well known Chemical Vapor Deposition (CVD) or other deposition processes.

Figure 3:
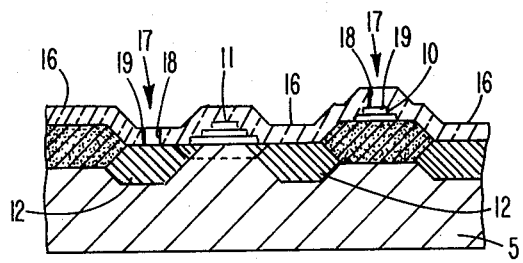
Figure 5:
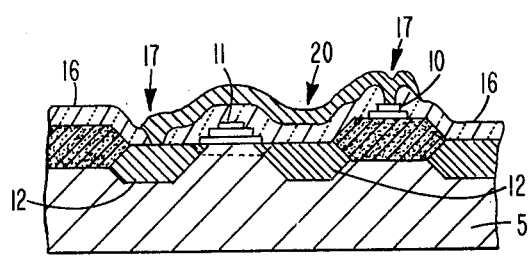

FIG. 3 shows a plurality of feed-through apertures 17—17 formed in the layer 16 to expose portions of the MOS device therebelow. As can be seen, the apertures 17—17 have steep sides 18—18 resulting in sharp upper corners 19—19. In a subsequent processing step it is necessary to deposit a conductive material 20 (e.g., aluminum), as shown in FIG. 5, on the layer 16. The material 20 also fills in the feed-through apertures 17—17 to make an electrical connection with the underlying portions. Undesirably, the conductive material 20 in the vicinity of the sharp corners 19—19 of the layer 16 is very thin and can cause failure of the semiconductor device fabricated using such techniques when high current densities pass therethrough, or when the device is subjected to other stresses.

One solution to this problem, once the feed-through apertures 17—17 are formed in the layer 16 (see FIG. 3), is to place the processed substrate 5 in a furnace for a time (e.g., 5 to 10 minutes) and at such a temperature (e.g., 1100° C.) so as to cause the insulating layer 16 to reflow and form a smooth topography in and about the feed-through apertures. When the conductive material 20 is deposited on the smoothed layer 16, as shown in FIG. 5, the thickness of the material is substantially uniform and the aforementioned failures are avoided. However, the exposure of the device to such high temperatures for extended periods of time has been found, in some instances, to cause dopants in the areas 12—12, as well as other areas, to diffuse into the substrate 5 as well as diffuse laterally, which can adversely affect the operation of the device.

Figure 6:
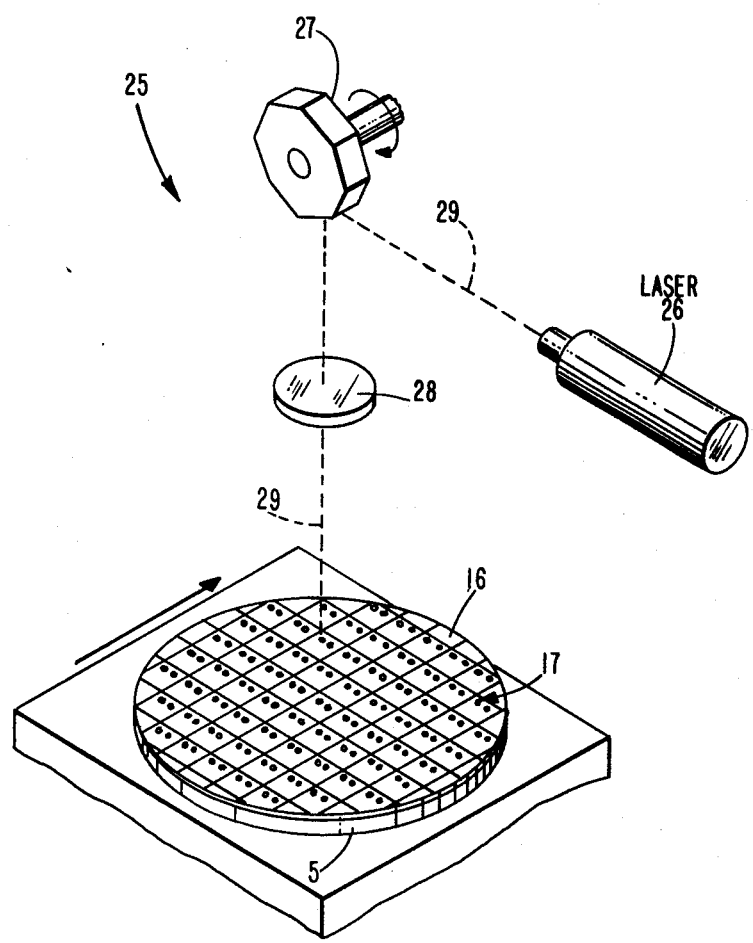

The instant invention precludes such problems by continuously scanning a laser beam over the insulating layer 16 having the feed-through apertures 17—17 therein. FIG. 6 depicts a schematic view of a laser scanning system, generally referred to by the numeral 25, for implementing such a technique. The substrate 5 with the apertured layer 16 (also see FIG. 3) is not drawn to scale for purposes of clarity of exposition. In actual practice the apertures 17—17 are approximately 5 $\mu$m in diameter, the layer 16 is about 1 $\mu$m thick and the substrate 5 is 500$\mu$m thick.

The scanning system 25 is comprised of a laser 26, a multi-faceted rotatable mirror 27, focusing optics 28 and a movable bed (not shown) on which the substrate 5 is positioned. In operation, the substrate 5 is placed on the movable bed and the laser 26 activated. A light beam 29 from the laser 26 is directed towards the multi-faceted mirror 27 which rotates clockwise (see arrow) and the beam is reflected toward the substrate 5 through the focusing optics 28. The beam 29 impinges on the layer 16 and moves laterally thereacross as the substrate 5 moves in the direction shown. The rotation of the mirror 27 in concert with the movement of the substrate 5 results in the layer 16 being raster scanned by the laser beam 29.

Figure 4:
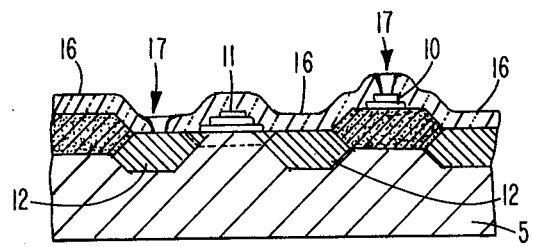

In a particular embodiment the laser 26 was a CW $CO_2$ laser having a wavelength of approximately 10.6

μm which had a dwell time on the layer 16 of about 1 msec. The layer 16 which was P-glass, approximately 1 μm thick, was exposed to $8:10^5$ watts/cm$^2$. A Q-switched $CO_2$ laser at the same frequency has also been used to reflow a phosphorous doped silicate glass layer 16; however, the CW $CO_2$ has been found to be more controllable. The substrate 5 is substantially transparent to the beam 29 while the P-glass layer 16 absorbs a substantial portion of the light energy at the 10.6 μm wavelength. Such selective coupling of the energy causes the P-glass layer 16 to reflow resulting in a smooth topography around the apertures 17—17 (see FIG. 4) with little or no heating of the substrate therebelow. Hence, minimal interlayer and lateral diffusion of the dopants occur.

Additionally, when the P-glass is vapor deposited on the substrate 5, it is in an unconsolidated state. The raster scanning of the P-glass layer 16 with the laser beam 29 densifies or consolidates the P-glass. Accordingly, the instant technique simultaneously densifies the P-glass layer 16 and forms a smooth surface topography around the apertures 17—17 upon reflow of the layer.

Once the laser reflow operation has been completed, the conductive material 20 is deposited on the layer 16 as shown in FIG. 5. The smooth surface topography of the feed-through apertures 17—17 results in a substantially uniform thickness of the metallic material 20 about the apertures which preclude the aforementioned problems.

It is to be understood that the embodiments described herein are merely illustrative of the principles of the invention. Various modifications may be made thereto by persons skilled in the art which will embody the principles of the invention and will fall within the spirit and scope thereof.

What is claimed is:

1. A method of forming an interlevel glass dielectric layer in a semiconductor device, comprising the steps of:

depositing a layer of glass dielectric material on a partially completed semiconductor device;

forming feed-through apertures in the glass dielectric material; and exposing the apertured glass dielectric layer to high energy laser radiation which is selectively coupled to said layer to reflow the layer to form a smooth surface topography around said apertures without substantially heating said partially completed semiconductor device.

2. The method as set forth in claim 1, wherein the exposing step is accomplished by:

continuously scanning a laser beam over the surface of the apertured dielectric layer.

3. The method as set forth in claims 1 or 2, wherein the dielectric layer is phosphorous doped silicate glass.

4. The method as set forth in claim 2, wherein:

the laser scanning step is accomplished with a beam from a CW $CO_2$ laser.

5. The method as set forth in claim 3, wherein the glass depositing step is accomplished by chemical vapor deposition.

6. The method as set forth in claim 5, wherein:

the step of continously scanning a laser beam simultaneously consolidates the vapor deposited dielectric glass layer and forms a smooth surface topography about said feed-through apertures.

7. The method as set forth in claims 1 or 2, wherein substantially all of the high energy radiation is absorbed by the dielectric material.

8. The method as set forth in claim 6, which further comprises the step of:

depositing a conductive material on the glass layer which electrically connects the surfaces of the semiconductor exposed through said feed-through apertures.

9. A method of forming a glass dielectric layer in a semiconductor device, comprising the steps of:

vapor depositing a layer of phosphorous doped silica glass on the surface of a semiconductor device;

forming feed-through apertures in the glass layer; and raster scanning a high energy laser beam over the apertured glass layer to simultaneously densify the vapor deposited glass layer and form a smooth surface topography about said feed-through apertures without substantially heating and thereby altering the properties of said semiconductor device therebelow.

* * * * *